(12) United States Patent
Thiruvengadam et al.

(10) Patent No.: US 11,783,185 B2
(45) Date of Patent: *Oct. 10, 2023

(54) ANALYSIS OF MEMORY SUB-SYSTEMS BASED ON THRESHOLD DISTRIBUTIONS

(71) Applicant: Micron Technology, Inc., Boise, ID (US)

(72) Inventors: Aswin Thiruvengadam, Folsom, CA (US); Daniel L. Lowrance, El Dorado Hills, CA (US); Joshua Phelps, Boise, ID (US); Peter B. Harrington, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/706,256

(22) Filed: Mar. 28, 2022

(65) Prior Publication Data

US 2022/0215261 A1   Jul. 7, 2022

Related U.S. Application Data

(63) Continuation of application No. 16/722,507, filed on Dec. 20, 2019, now Pat. No. 11,295,209.

(51) Int. Cl.
*G11C 29/00* (2006.01)
*G06N 3/08* (2023.01)
*G06F 11/22* (2006.01)
*G06N 3/04* (2023.01)
(Continued)

(52) U.S. Cl.
CPC .............. *G06N 3/08* (2013.01); *G06F 11/008* (2013.01); *G06F 11/2257* (2013.01); *G06F 11/2263* (2013.01); *G06N 3/04* (2013.01); *G11C 29/50* (2013.01); *G11C 2029/5004* (2013.01)

(58) Field of Classification Search
CPC .......... G06N 3/08; G06N 3/04; G06F 11/008; G06F 11/2257; G06F 11/2263; G11C 29/50; G11C 2029/5004
See application file for complete search history.

(56) References Cited

U.S. PATENT DOCUMENTS

| | | | |
|---|---|---|---|
| 10,726,930 B2* | 7/2020 | Sarkar | ................... G06F 3/0619 |
| 11,295,209 B2* | 4/2022 | Thiruvengadam | ........................... G06F 11/2257 |
| 2008/0195903 A1 | 8/2008 | Zipprich-Rasch | |

(Continued)

*Primary Examiner* — Christine T. Tu
(74) *Attorney, Agent, or Firm* — Lowenstein Sandler LLP

(57) ABSTRACT

Disclosed is a system comprising a memory component having a plurality of memory cells capable of being in a plurality of states, each state of the plurality of states corresponding to a value stored by the memory cell, and a processing device, operatively coupled with the memory component, to perform operations comprising: obtaining, for the plurality of memory cells, a plurality of distributions of threshold voltages, wherein each of the plurality of distributions corresponds to one of the plurality of states, classifying each of the plurality of distributions among one of a plurality of classes, generating a vector comprising a plurality of components, wherein each of the plurality of components represents the class of a respective one of the plurality of distributions, and processing, using a classifier, the generated vector to determine a likelihood that the memory component will fail within a target period of time.

20 Claims, 11 Drawing Sheets

(51) Int. Cl.
*G06F 11/00* (2006.01)
*G11C 29/50* (2006.01)

(56) References Cited

U.S. PATENT DOCUMENTS

| | | | |
|---|---|---|---|
| 2010/0199150 A1* | 8/2010 | Shalvi | G11C 16/344 |
| | | | 711/E12.001 |
| 2019/0189229 A1* | 6/2019 | Lee | G11C 16/3459 |
| 2021/0014102 A1 | 1/2021 | Singh et al. | |
| 2021/0166772 A1 | 6/2021 | Choi | |

\* cited by examiner

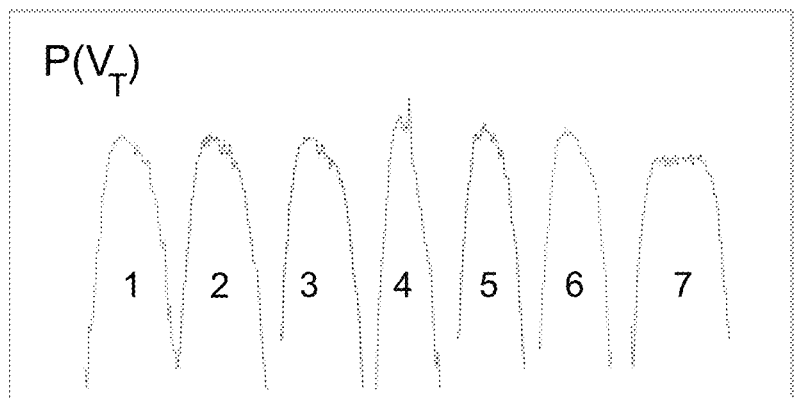
FIG. 5A — Good
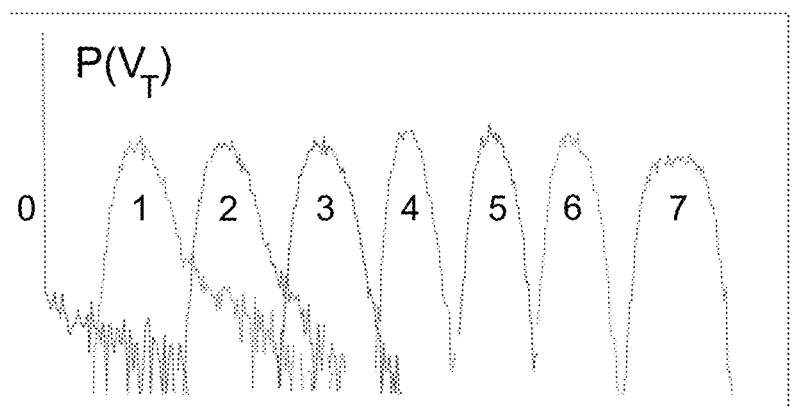
FIG. 5B — Top tails: 0, 1, 2, 3
FIG. 5C — Erased

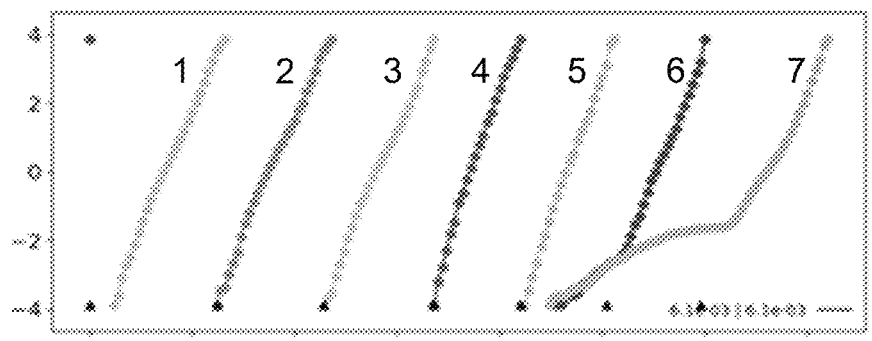
FIG. 6B  Valid tail: 7 (bottom tail)
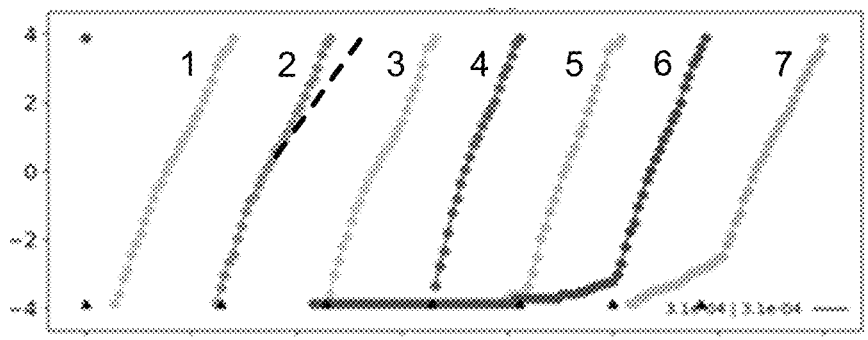
FIG. 6C  Valid tail: 7 (bottom tail)
Ignorable tails: 2, 6

ANALYSIS OF MEMORY SUB-SYSTEMS BASED ON THRESHOLD DISTRIBUTIONS

RELATED APPLICATIONS

The present application is a continuation of U.S. patent application Ser. No. 16/722,507, filed Dec. 20, 2019, which is incorporated by reference herein.

TECHNICAL FIELD

Embodiments of the disclosure relate generally to memory sub-systems, and more specifically, relate to analyzing a memory sub-system based on threshold distributions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure.

FIG. 5A illustrates a structured histogram depicting actual distributions of threshold voltages for a robust TLC memory cell in which various distributions are sufficiently separated from each other in accordance with some embodiments of the present disclosure.

FIG. 5B illustrates a structured histogram depicting actual distributions of threshold voltages for a compromised TLC memory cell in which some distributions overlap significantly with each other, in accordance with some embodiments of the present disclosure.

FIG. 5C illustrates a structured histogram depicting actual distributions of threshold voltages for a compromised TLC memory cell in which some distributions are erased, in accordance with some embodiments of the present disclosure.

FIG. 6B illustrates one exemplary set of quantile-quantile representations for seven different distributions of threshold voltages of a TLC memory device, in accordance with some embodiments of the disclosure.

FIG. 6C illustrates another one exemplary set of quantile-quantile representations for seven different distributions of threshold voltages of another TLC memory device, in accordance with some embodiments of the disclosure.

DETAILED DESCRIPTION

Figure 1:
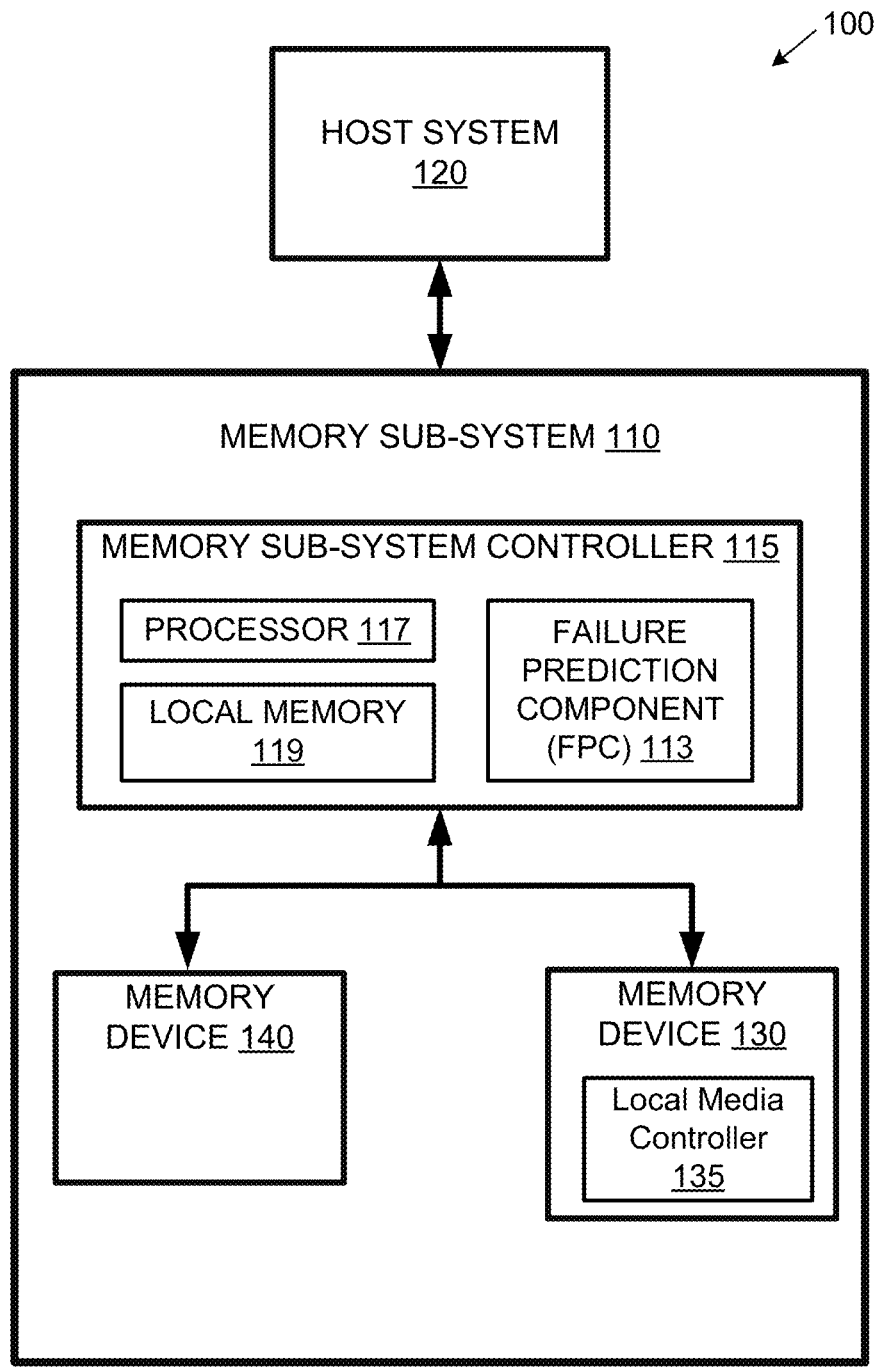
FIG. 1 illustrates an example computing system that includes a memory sub-system in accordance with some embodiments of the present disclosure.

Aspects of the present disclosure are directed to analyzing a memory sub-system based on threshold distributions. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

Storage of data on certain memory devices having different media types relies on precise placement of electric charges into memory cells of the memory devices. The amount of charge placed on a memory cell may be used to represent a value stored by the memory cell. Depending on the amount of the charge placed, passage of electric current through the memory cell may require an application of a value-specific threshold voltage. Readability of the memory cells depends critically on distinctiveness of threshold voltages representing different stored values. Because of inevitable variations in sizes, locations, and environments of various memory cells, even if implemented on the same substrate, the threshold voltages that correspond to a given value for various memory cells are not identical and fall within a distribution of some voltage width. Yet, as long as the distributions corresponding to different values overlap insignificantly, an occasional erroneously stored value may be detected and corrected by an error-correction code.

With time passing and multiple write/read operations performed, however, the distributions may become shifted, broadened, or otherwise distorted so that the distinctiveness of representation of different stored values may become compromised, resulting in an eventual failure of the memory device. Such a memory failure, when occurring unexpectedly, may result in a loss of critical data and a wider system failure. Deterioration of distributions of a memory device often occurs gradually with time and can potentially be detected at earlier stages, before a critical failure occurs. However, the traditional monitoring of distributions is time consuming and relies on human intervention for accurate data analysis.

Aspects of the present disclosure address the above and other deficiencies by having a memory sub-system that includes a trained classifier capable of detecting distribution features (such as shift, tails, erasures, and do on) that may be indicative of an impending failure. The classifier can be a trained machine-learning model, in some embodiments. The classifier can be trained on a number of datasets (e.g., distribution histograms) that may include datasets representing good memory devices (those that are not in danger of failing) as well as failed devices and/or critical devices (those that are likely to fail within a certain period of time). During a training phase, the classifier can develop associations between a particular set of distribution features (e.g., simultaneous presence of various tails in multiple distributions) and a likelihood of failure. During a detection (identification) phase, the trained classifier can obtain a histogram characterizing distributions of voltage thresholds of some subset of memory cells of the memory device under testing, extract distribution features and classify the distributions among several classes. Based on the obtained class, the classifier can determine the likelihood that the memory device will fail in the near future.

Advantages of the present disclosure include, but are not limited to enabling a quick automated "on-the-fly" monitoring of the soundness of memory devices. Traditionally, the use of distribution histograms for product control has been hindered by a significant time required for collecting distribution data and analyzing histograms. Although data collection time has been significantly reduced in hardware-accelerated platform solutions, the analysis still requires a human engineering input and represents a crucial bottleneck in efficient memory device monitoring. A high volume memory platform may require, for its monitoring, large amounts of distribution data that may strain engineers of even a large-scale memory device manufacturer. Furthermore, where after-sale monitoring of the memory devices is concerned, smaller clients may either have to incur significant expenses in order to undertake such monitoring on a regular basis or forgo it completely. In this context, the automated dynamic on-the-fly detection of problematic memory issues represents a significant technical improvement.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transitor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115, for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a failure prediction component (FPC) 113 capable of ascertaining conditions (e.g., distributions of voltage thresholds) of one or more memory devices 130 and/or 140 and determining if the memory devices are likely to fail within a certain time interval in the future, such as the next month, the next week, and so on. In some instances, the FPC 113 can determine the likelihood of failure for a given number of future memory operations (e.g., write, erase, reprogram, read, and so on). The FPC 113 can further determine, based on an average intensity of use (such the number of write/read operations per interval of time) when the memory device is likely to fail. In some embodiments, the FPC 113 can initiate testing upon receiving indications from the ECC (not shown) of the controller 115 that the ECC has failed to correct errors in the data associated with a write operation performed on some partition (page, block) of the memory device 130 (or 140 or any other memory device that is not shown). The ECC can be based on Hamming, Reed-Solomon, BCB, low density parity check (LDPC) algorithms, or any other error-correction algorithms.

In some embodiments, the FPC 113 can receive instructions to perform a memory device check from the host system 120. For example, the host system can detect receiving corrupt data from the memory sub-system 110 that the memory sub-system controller 115 has failed to detect and/or correct. In some embodiments, the FPC 113 can perform monitoring of the memory devices at scheduled time intervals even if no instructions to initiate a check is received from the memory sub-system controller 115 or the host system 120. In some embodiments, the monitoring schedule can be stored in the local memory 119 (e.g., in the embedded memory of the local memory 119).

In some embodiments, the memory sub-system controller 115 includes at least a portion of the FPC component 113. For example, the memory sub-system controller 115 can include a processor 117 (processing device) configured to execute instructions stored in local memory 119 for performing the operations described herein. In some embodiments, the FPC 113 is part of the host system 110, an application, or an operating system. In some embodiments, the FPC 113 can have configuration data, libraries, and other information stored in the memory device 130 (and/or the memory device 140).

The FPC 113 can be based on one or more machine learning models. The model(s) can include multiple neuron layers and can be trained prior to being installed in the memory sub-system 110. In some implementations, the model(s) can be trained in accordance with the description of FIG. 2 below. The training phase can be performed on a separate computing system (e.g., on the manufacturer's side), embedded into the local memory 119 during a production stage, and invoked by the FPC 113 for scheduled monitoring and/or unscheduled on-the-fly check-ups. Further details about the operations of the FPC 113 are described below.

Figure 2:
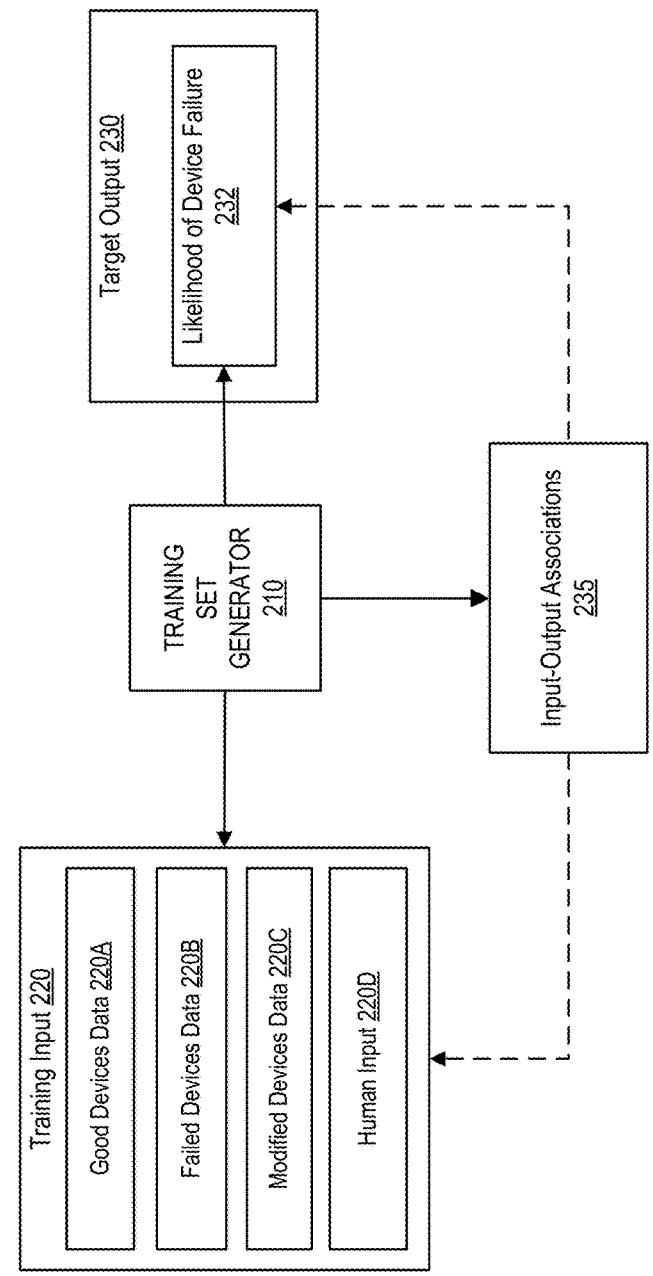
FIG. 2 illustrates schematically a training phase for training a machine-learning classifier that can be used for predicting a likelihood of a potential failure of a memory device, in accordance with some embodiments of the present disclosure.

FIG. 2 illustrates schematically a training phase 200 for training a machine-learning classifier that can be used for predicting a likelihood of a potential failure of a memory device (component), in accordance with some embodiments of the present disclosure. To train the machine-learning model to detect impending memory device failures, the training phase 200 can generate training sets for training the machine-learning model. The training set generator 210 can generate training input 220, for example by obtaining good devices data 220A, failed devices data 220B, modified good devices data, human input 220D, and the like. The training input 220 can include voltage distributions for various similar memory devices, such as memory devices having the same number of levels per memory cell as the target device being tested. For example, a model intended to test a target TLC memory device, which stores up to 8 bits per memory cell, can be trained using data for similar TLC memory devices. In some embodiments, with use, a TLC memory device may no longer be capable of storing three bits per cell, due to the broadening of its threshold voltage distributions, and be consequently used as an MLC device (with only 4 bits stored per memory cell). Accordingly, the training inputs 220 for such a TLC device can additionally include MLC (or even SLC) training data.

In some embodiments, the good devices data 220A can include threshold distributions for a variety of devices that are deemed (e.g., by an engineer) to be devices that are not likely to fail within a target time period (or a target number of memory operations) after inspection. For example, the good devices data 220A can have distributions that are close to a normal (Gaussian) distribution, each having such a mean and width (sigma) that result in an insignificant overlap with other (e.g., adjacent) voltage distributions. The overlap can be insignificant if it involves rare events (threshold voltages in individual cells) in both distributions that occur with low enough probability—e.g., 3-sigma, 3.5-sigma, etc.—so that the anticipated rare errors, taken on the scale of the memory device, do not compromise the device integrity. The good devices data 220A can also include stronger overlaps, e.g., 2.5-sigma, that correspond to events that are more frequent, but that can still be correctable by the ECC of the memory sub-system controller 115.

In some embodiments, the failed devices data 220B can include threshold distributions for a variety of devices that have already failed or are deemed to be devices that are likely to fail within a target time period (or upon a target number of operations) after inspection. For example, the failed devices data 220B can include distributions that deviate from good distributions. For example, a distribution can still be normal but shifted towards an adjacent distribution so significantly that the ECC can no longer be able to correct for the resulting errors. This can happen in instances where a read operation returns too many incorrect values that are different from the values originally stored in the memory cells. As another example, the failed devices data 220B can include distributions that are broadened significantly enough to reach into the adjacent distributions, so that an unacceptable overlap (e.g., 2-sigma, 2.5-sigma, etc.) develops between the two distributions. As another example, one or more of the distributions can be non-normal and develop a tail that extends sufficiently far into an adjacent distribution. In some failed devices, none of the distributions can have significant shifts/tails/broadenings that would result in a failure, if present alone. Yet, when taken in their entirety, multiple distributions that have smaller deviations can still indicate a compromised device integrity and, therefore, can be included in the failed devices data 220B.

In some embodiments, the good devices data 220A and the failed devices data 220B can include distributions for various actual (physical) devices. But because collecting such actual data from numerous physical devices can sometimes be a prohibitively difficult or expensive task, the training input 220 can additionally include modified devices data 220C. In some implementations, the modified devices data 220C can be based on (actual or ideal) memory devices that are in good conditions but whose threshold distributions can be artificially modified to resemble a failed device or a device that can fail in the future. For example, a set of good distributions can be artificially shifted, broadened, or outfitted with tail that extend further out to lower (bottom tail) or higher (top tail) threshold voltage values. In some implementations, the modified devices data 220C can be based on distributions for memory devices that actually failed (or are deemed to be in danger of failing) but modified in some way that lessens the critical features. For example, some tails can be reduced, or even removed completely, some distributions can be back-shifted closer to their normal locations, narrowed, etc.

The training input 220 can further include a human input 220D. The human input 220D can include classification of other input data, in some embodiments. For example, the human input can rate the good devices data 220A and failed devices data 220B on a quasi-continuum scale by placing various distributions of threshold voltages into a number of buckets, ranked by the likelihood of failure within a target time after testing. In one exemplary embodiment, distributions can be ranked by a bucket number, using a scale from 0 to 10, with the bucket number 0 corresponding to a memory device that is less than 1% likely to fail within the next month. Bucket number 1 can correspond to about 10% probability of failure, bucket number 2 can correspond to 20% probability, and so on, with bucket number 10 corresponding to a virtual certainty of a failure within the target time. The bucket number(s) can serve as an additional input into the machine-learning classifier illustrated in FIG. 2 and can be processed by neural layers of the classifier to establish associations between the likelihood of failure and specific features of the training distributions.

Various training inputs 220 can be selected by a training set generator 210, which can also select a target output 230, such as a likelihood of device failure 232. The training set generator 210 can further establish input-output associations 235 between training inputs 220 and the corresponding target output 230. In establishing the input-output associations 235, the training set generator can use algorithms of grouping and clustering, such as the Density-based spatial clustering of applications with noise (DBSCAN) algorithm, or similar algorithms. The training set generator 210 can further store the training set comprising the training input, the target output of resignation, and the input-output association on the computer-readable storage medium (not shown).

Figure 3A:
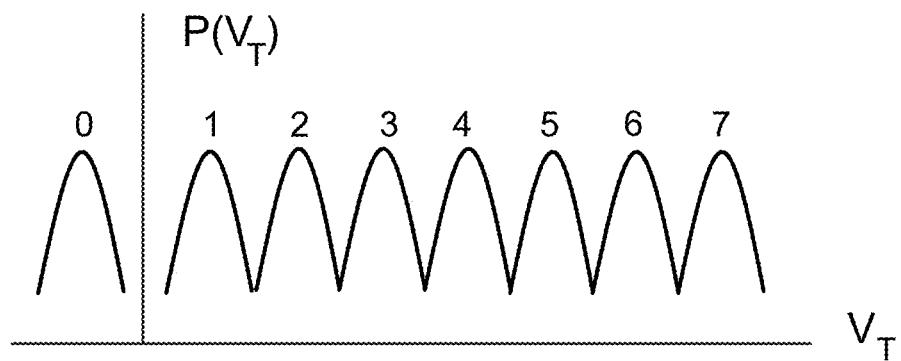
FIG. 3A illustrates schematically a structured histogram depicting distributions of threshold voltages for a robust memory cell capable of storing three bits of data, in accordance with some embodiments of the present disclosure.
Figure 3B:
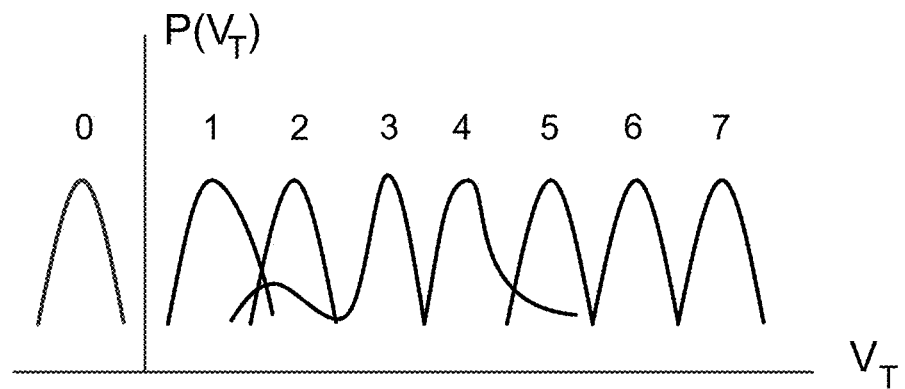
FIG. 3B illustrates schematically a conditional histogram depicting distributions of threshold voltages for a compromised TLC memory cell, in accordance with some embodiments of the present disclosure.
Figure 3C:
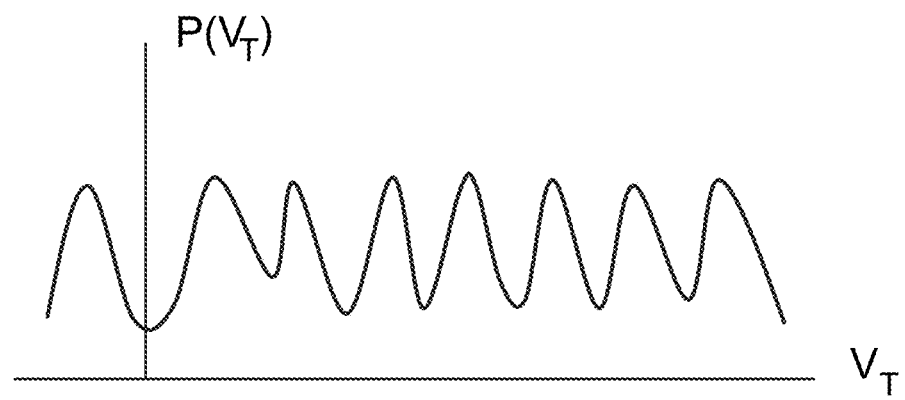
FIG. 3C illustrates schematically unstructured distribution data, as can be harvested by the memory sub-system controller, in accordance with some embodiments of the present disclosure.

FIGS. 3A-C illustrate various possible threshold voltage distributions of memory devices. The distributions shown in FIGS. 3A-C can corresponds to various training input distributions of FIG. 2, in some embodiments. In other embodiments, the distributions shown in FIGS. 3A-C can corresponds to target inputs of the detection (identification) phase. In some embodiments, the distributions shown in FIGS. 3A-C can describe states of transistor-based memory cells, such as metal-oxide-semiconductor field effect transistor (MOSFET) memory cells. A transistor can have a source electrode and a drain electrode to pass electric current there through. A memory cell can further have a control gate electrode to receive a voltage signal $V_{CG}$ to control the magnitude of the electric current flowing between the source electrode and the drain electrode. In some embodiments, voltage signals that are less than a threshold control gate voltage $V_T$ (herein also referred to as the "threshold voltage", $V_{CG} < V_T$, can result in a low source-drain electric current. The current can increase substantially once the control gate voltage has exceeded the threshold voltage, $V_{CG} > V_T$. Because the actual geometry of gates and electrodes of a memory cell (as well as the environment of the memory cell) can vary from cell to cell, the threshold voltages $V_T$ can be different even for transistors implemented on the same die. As a result, transistors of the same memory device can be characterized by a distribution of their threshold voltages, $P(V_T) = dW/dV_T$, where $dW = P(V_T) dV_T$ represents a probability that any given transistor has its threshold voltage within the interval $[V_T, V_T + dV_T]$.

In memory devices with non-volatile memory cells, a cell can be further equipped with a conducting island—a floating gate—that can be electrically isolated from the control gate, the source electrode, and the drain electrode by insulating layers. In response to an appropriately chosen positive (in relation to the source potential) control gate voltage $V_{CG}$, the floating gate can receive (via Fowler-Nordheim tunneling or hot electron injection) a negative electric charge Q, which can be permanently stored thereon even after the power to the memory cell—and, consequently, the source-drain current—is ceased. The presence of charge q generally shifts the distribution of threshold voltages, $P_q(V_T)$ compared with the distribution $P(V_T)$ for an uncharged floating gate. This happens because a stronger positive control gate voltage $V_{CG}$ can be needed to overcome a negative potential of the floating gate charge q. If any charge of a sequence $q_k$ of charges with $1 \le k \le 2^N$ can be selectively programmed (and later detected during a read operation) into a memory cell, the memory cell can function as an N-bit storage unit. To function properly as a memory cell, the cell should ideally have adjacent voltage distributions $P_q(V_T)$ that are sufficiently separated, e.g., by a valley margin.

FIG. 3A illustrates schematically a structured histogram depicting distributions of threshold voltages for a robust memory cell capable of storing three bits of data, in accordance with some embodiments of the present disclosure. FIG. 3A shows distributions of threshold voltages $P(V_T)$ for 8 different charge states of a tri-level cell (TLC). The numbers 0, 1 ... 7 enumerate various states of the TLC. For example, a memory cell programmed into a charge state 0 can represent stored value 111, state 1 can represent stored value 011, state 2 can represent stored value 001, and so on. The distributions in FIG. 3A illustrate distributions of a memory device having a robust separation ("good distributions") between various charge states of memory cells of some memory device. The distributions in FIG. 3A can (in some instances) be approximated as the normal (Gaussian) distributions.

FIG. 3B illustrates schematically a conditional histogram depicting distributions of threshold voltages for a compromised TLC memory cell, in accordance with some embodiments of the present disclosure. Depicted in FIG. 3B are good distributions 0, 1, 2, 5, 6, and 7, which are similar to those depicted in FIG. 3A. In contrast, distributions 3 and 4 are distorted distributions. The distribution 3 is a "bottom tail" distribution that extends beyond the normal distribution towards the lower (than the mean) values of the threshold voltage $V_T$. The distribution 3 is a "top tail" distribution that extends beyond the normal distribution towards the higher (than the mean) values of the threshold voltage $V_T$. The distribution 3 overlaps significantly with the adjacent distribution 2 (and even extends into the range of $V_T$ corresponding to distribution 1). As a result, a substantial fraction of the memory cells of the device cannot reliably differentiate between stored values 101 and 001, in one illustrative example. Similarly the distribution 4 overlaps significantly with the distribution 5, which can lead to a lack of differentiation between stored values 100 and 000, in one illustrative example. (The actual values can depend on a specific encoding scheme used by the memory device under testing.)

The distributions depicted in FIGS. 3A and 3B are "structured" histograms, in which different charge states have distributions that are individually displayed. In contrast, FIG. 3C illustrates schematically unstructured distribution data, as can be harvested by the memory sub-system controller 115, in accordance with some embodiments of the present disclosure. The unstructured data depicted in FIG. 3C can be a sum of all distributions collected as part of a hardware background check-up operation. In some embodiments, the memory sub-system controller 115 can perform separation of the unstructured data into a set of structured histograms as depicted in FIGS. 3A and 3B. For example, the machine-learning model can be trained with unconditional data. To reduce the number of possibilities that an element of data belongs to various distributions (e.g., a top tail and a bottom tail of two adjacent distributions), a window function can be used to extract data that belong to various distributions. This can be used to make predictions for each extracted distribution. The training data may be generated by combining the unconditional data with the data whose association with specific distributions is known.

Figure 4:
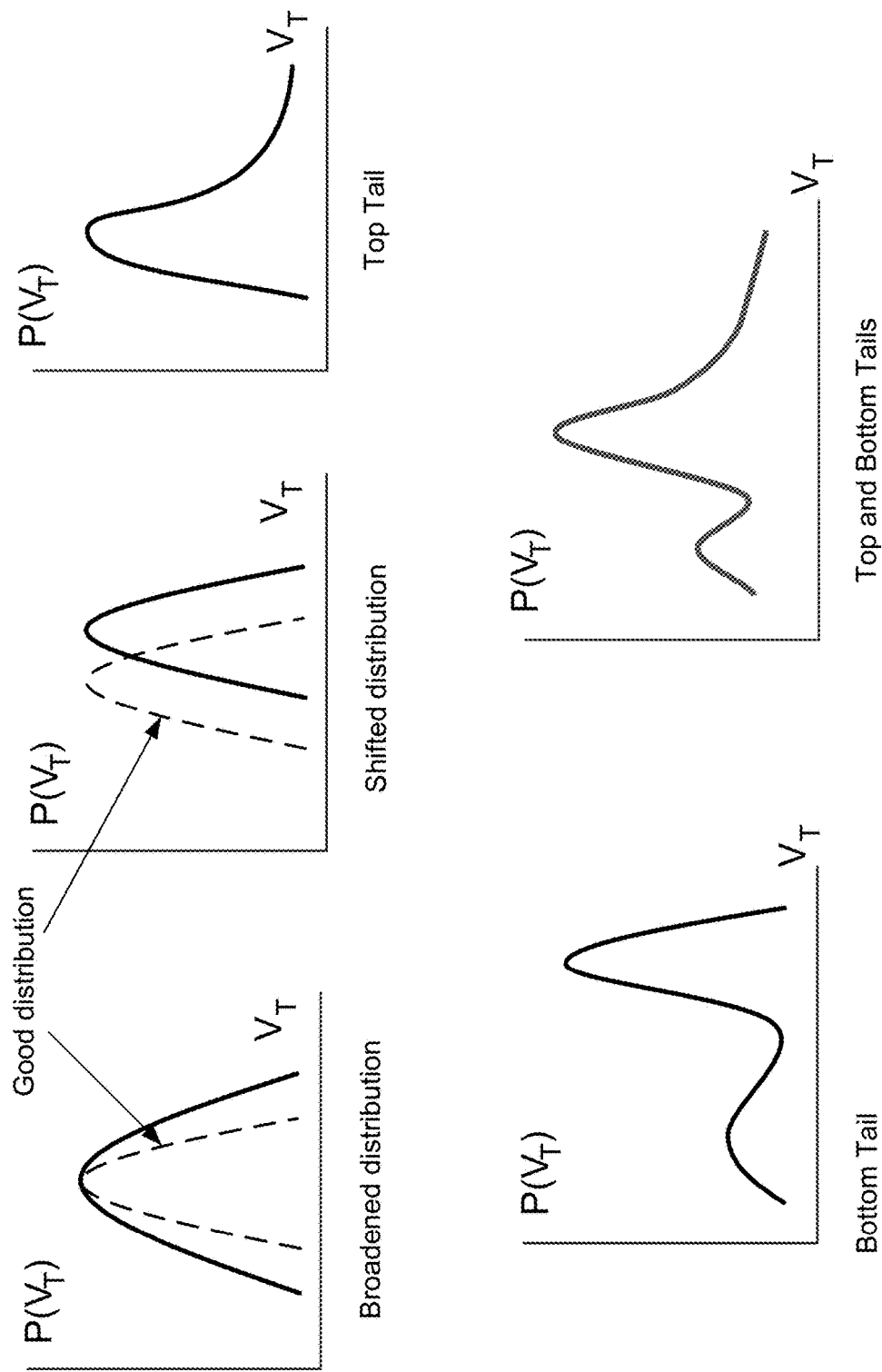
FIG. 4 illustrates one exemplary classification of various features of threshold voltage distributions, in accordance with some embodiments of the present disclosure.

FIG. 4 illustrates one exemplary classification of various features of threshold voltage distributions, in accordance with some embodiments of the present disclosure. A good distribution (depicted by the dashed line) can be a normal distribution or some other control distribution. A broadened distribution can have the same mean (or median) as the good distribution but can have a different (larger) width. A shifted distribution can have the same width as the good distribution but a different mean (or median). In some embodiments, a processing device performing classification can ignore broadenings that are less than some pre-determined threshold values (e.g., 0.5 sigma, 0.75 sigma) and treat the corresponding distribution as a good distribution. Similarly, in some embodiments, shifts that are less than some pre-determined threshold shifts (e.g., 0.25 sigma, 0.5 sigma) can be ignored. The mean values and sigmas of good distributions can be stored in the memory sub-system 110, e.g., in the local memory 119, in one embodiment.

The distributions that have a tail extending into high values of threshold voltages can be classified as "top tails." The distributions that have a tail extending into low values of threshold voltages can be classified as "bottom tails." In some embodiments weak but long tails (in a more quantitative sense described below, in relation to FIG. 8), which correspond to rare events (occasional memory cells), can be ignored. Similarly, strong but short tails, which do not depart far from the mean (or median) can also be ignored. In those instances where a distribution has two tails extending towards higher and lower voltages, the processing device performing classification can classify such distribution as a "top and bottom tail" distribution. In some embodiments, additional classes of distributions can be implemented. For example, various tail classes can be subdivided into a number of sub-classes identifying the strength of the tail. In some embodiments, the tail can be quantified by computing how strongly the mean square deviation in the actual distribution departs from the sigma of the good distribution. In some embodiments, the computation can be performed for the bottom/top part of the distribution, in order to differentiate bottom tails from the top tails. In other embodiments, the processing device can use various other schemes to quantify tail strengths.

FIGS. 5A-C illustrate various threshold voltage distributions of memory devices, in accordance with some embodiments of the present disclosure. The distributions shown in FIGS. 5A-C can correspond to target input distributions of FIG. 2, in some embodiments. In other embodiments, the distributions shown in FIGS. 5A-C can correspond to training inputs. FIG. 5A illustrates a structured histogram depicting actual distributions of threshold voltages for a robust TLC memory cell in which various distributions are sufficiently separated from each other in accordance with some embodiments of the present disclosure. As depicted in FIG. 5A, some of the distributions (e.g., 1 and 5) can be closer to a normal distribution whereas other distributions (e.g., 7) can have significant departures from a normal distribution. Accordingly, a robust separation between distributions can be a better indicator of a good memory device compared to how closely a specific distribution follows a normal distribution.

FIG. 5B illustrates a structured histogram depicting actual distributions of threshold voltages for a compromised TLC memory cell in which some distributions overlap significantly with each other, in accordance with some embodiments of the present disclosure. As depicted in FIG. 5B, distributions 0, 1, 2, and 3 have top tails, with the distributions 0 and 1 displaying the most pronounced tails. The histogram of FIG. 5B can indicate that distinction between states 0 and 1, 1 and 2, 2 and 3, and (possibly) 3 and 4 is significantly compromised, to an extent that the ECC can fail to error-correct ensuing hardware malfunctions.

FIG. 5C illustrates a structured histogram depicting actual distributions of threshold voltages for a compromised TLC memory cell in which some distributions are erased, in accordance with some embodiments of the present disclosure. As depicted in FIG. 5C, all distributions are essentially non-distinguishable from each other. In other instances, however, only some of the distributions (e.g., 5, 6, and 7) can be erased whereas other distributions can be good (or have features as described above).

Figure 6A:
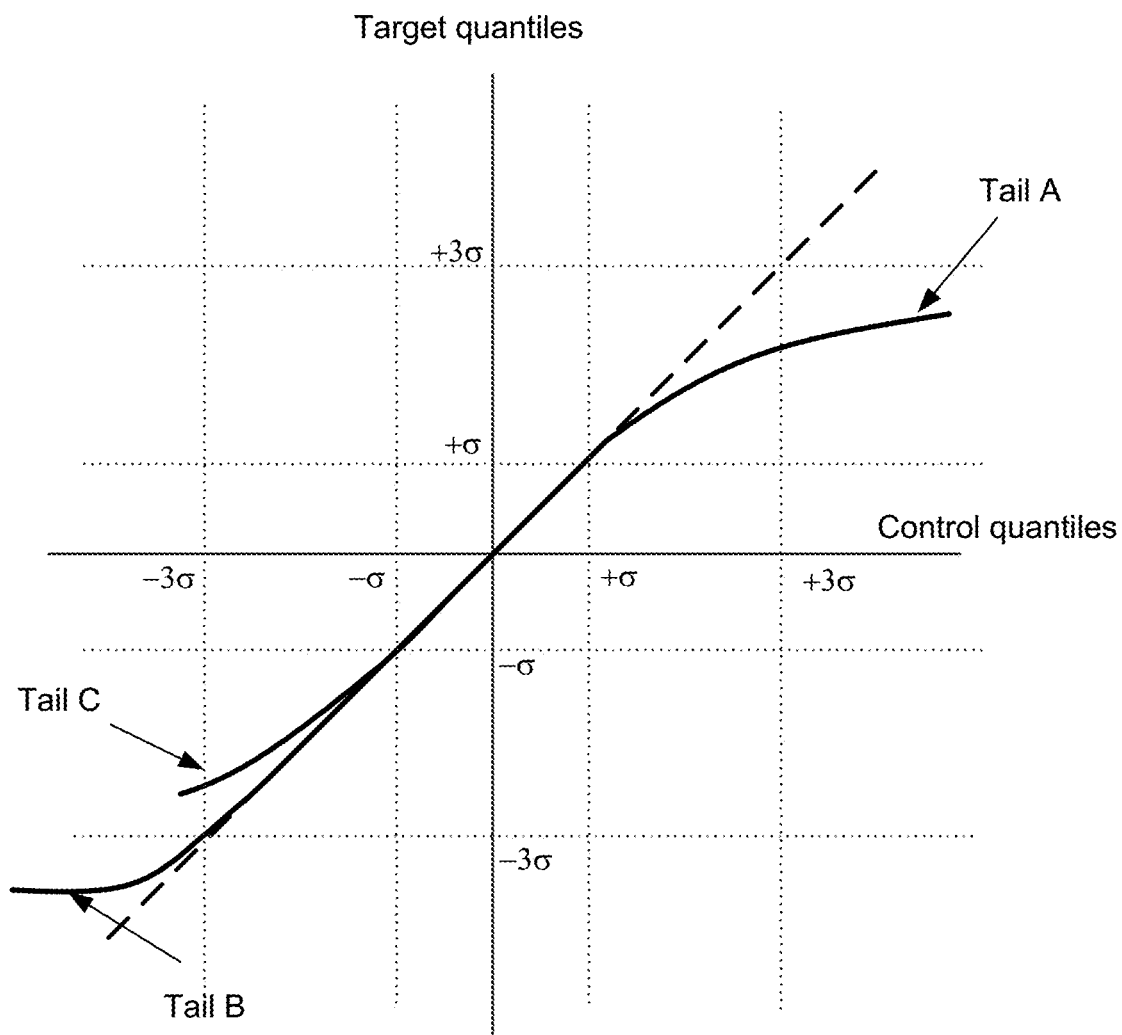
FIG. 6A illustrates classification of some exemplary tail features using a quantile-quantile representation (QQR) of a distribution of threshold voltages corresponding to a certain state of the memory cells of a target device distributions in relation to a control distribution, in accordance with some embodiments of the disclosure.

FIGS. 6A-C illustrate quantile-quantile representations of various threshold voltage distributions in relation to a control distribution. The control distribution can be an actual distribution for a good device or some model distribution (e.g., a normal distribution) which approximates an ideal memory device. Various distributions illustrated in FIGS. 6A-C can corresponds to target input distributions of FIG. 2, in some embodiments. In other embodiments, the distributions shown in FIGS. 6A-C can corresponds to training inputs. FIG. 6A illustrates classification of some exemplary tail features using a quantile-quantile representation (QQR) of a distribution of threshold voltages corresponding to a certain state of the memory cells of a target device distributions in relation to a control distribution, in accordance with some embodiments of the disclosure. A QQR can map a distribution of threshold voltages of the actual target device $P(V)$ to a control distribution $P_C(V)$. The processing device constructing a QQR can first determine (e.g., by counting available points in the available set of data) the quantiles $Q$ (e.g., percentiles) for the target distribution, $P(V) \rightarrow Q(V)$. The quantiles $Q(V)$, in conjunction with their inverse $V(Q)$, represent specific threshold voltages $V$ that correspond to various percentiles (e.g., $Q=0.1$ can correspond to the $10^{th}$ percentile of the distribution $P(V)$, $Q=0.84$ can correspond to the $84^{th}$ percentile, and so on). Similarly, the control distribution $P_C(V)$ can have its own set of quantiles $Q_C$: $P_C(V) \rightarrow Q_C(V)$. The QQR can be a (in some embodiments, quasi-continuous) plot $Q(V(Q_C))$ that indicates positions of target quantiles $Q$ for various quantiles $Q_C$ of the control distribution. As shown in FIG. 6A, the target distribution that coincides with the control distribution is represented by the dashed line $Q=Q_C$.

FIG. 6A illustrates various possible departures (features) of the target distribution $P(V)$ from the control distribution, in terms of the QQR. For example, tail A is a top tail that indicates a significant departure from the control distribution starting from about +1 sigma and is representative of a likely negative performance of the target memory device. Tail B is a bottom tail that indicates a significant departure from the control distribution starting from about −3 sigma. Such a tail can, in some instances, indicate a relatively insignificant performance issue of the memory device because it is confined to a range of voltages that correspond to relatively rare—as low as 1%—events (in other words, only rare memory cells have threshold voltages within the tail B). Accordingly, tail B and other tails that are confined to very low or very high quantiles (e.g., whose probability of occurrence is below a certain cut-off value, such as + or −3 sigma) can be ignored. As another example, tail C is a bottom tail that (unlike tail B) starts at relatively common events (−1 sigma) but can, in some embodiments, be similarly ignored because it does not depart sufficiently far from the control distribution and, therefore, is unlikely to cross over into adjacent state distributions. In some embodiments, the following procedure can be implemented to determine if a tail is to be ignored. First, the tails in which all or most points (e.g., above 80% or 90% of the total tail points) correspond to rare events, $|Q|>Q_1$ (e.g. $Q<-3$ sigma or $Q>3$ sigma), can be ignored. Second, tails which start (or whose points are mostly confined) within the region $|Q|<Q_1$ can also be ignored provided that the tail remains within a second cut-off value $Q_2$ from the line $Q=Q_C$ (at least until it reaching the first cut-off value $Q_1$): $|\Delta Q|<Q_2$. In various embodiments, the distance $\Delta Q$ can be determined along the horizontal direction of the QQR plot, along the vertical direction of the QQR plot, or along a direction of the shortest distance from the diagonal line $Q=Q_C$, on in some other way. A person skilled in the art will appreciate that the above are only some exemplary schemes and that there are virtually unlimited ways to establish when a particular tail can be ignored because it represents either 1) rare events, or 2) an insignificant departure from the control distribution that does not substantially affect the memory device functionality. In some embodiments, the cut-off value for top and bottom tails can be chosen to be different from each other.

FIG. 6B illustrates one exemplary set of quantile-quantile representations for seven different distributions of threshold voltages of a TLC memory device, in accordance with some embodiments of the disclosure. Distribution 7 is shown to have a valid bottom tail (that starts at about −2 sigma) whereas distribution 6 has a tail that can be ignored because, although it starts at about −2.5 sigma, it does not substantially depart from the straight line before it reaches the cut-off value −3 sigma. FIG. 6C illustrates another one exemplary set of quantile-quantile representations for seven different distributions of threshold voltages of another TLC memory device, in accordance with some embodiments of the disclosure. Distribution 7 has a valid bottom tail whereas distribution 6 has a tail that, although significant, is confined to the values that are less than −3.5 sigma. Also depicted schematically (by the dashed line) is a top tail in distribution 2 that can be ignored because it does not substantially depart from the straight line before it reaches a cut-off value (e.g. +3 sigma). The dashed line tail in distribution 2 illustrates how a good distribution can be modified (e.g., edited by an engineer) to diversify an available set of memory device distributions for the purpose of training the classifier.

Figure 7:
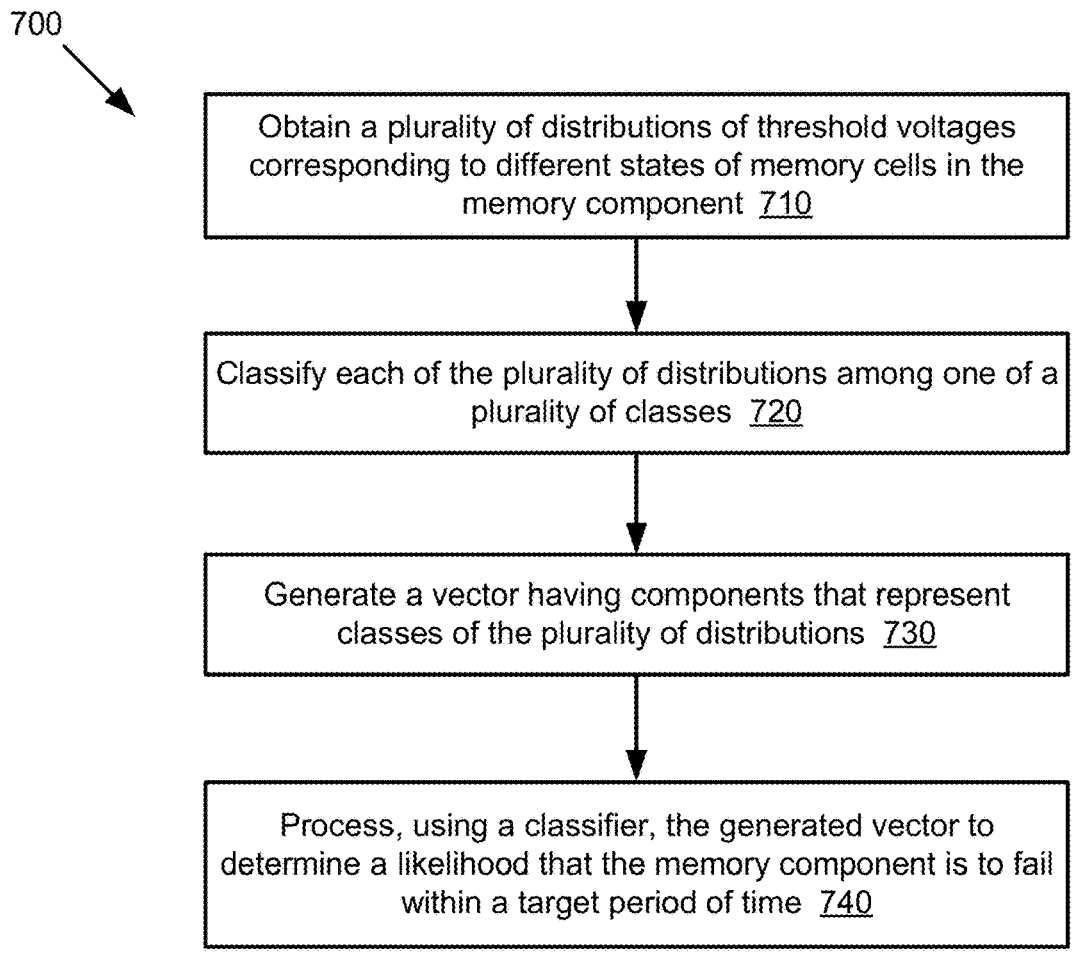
FIG. 7 illustrates a flow diagram of an example method to predict a likelihood of a potential failure of a memory device (component), in accordance with some embodiments of the present disclosure.
Figure 8:
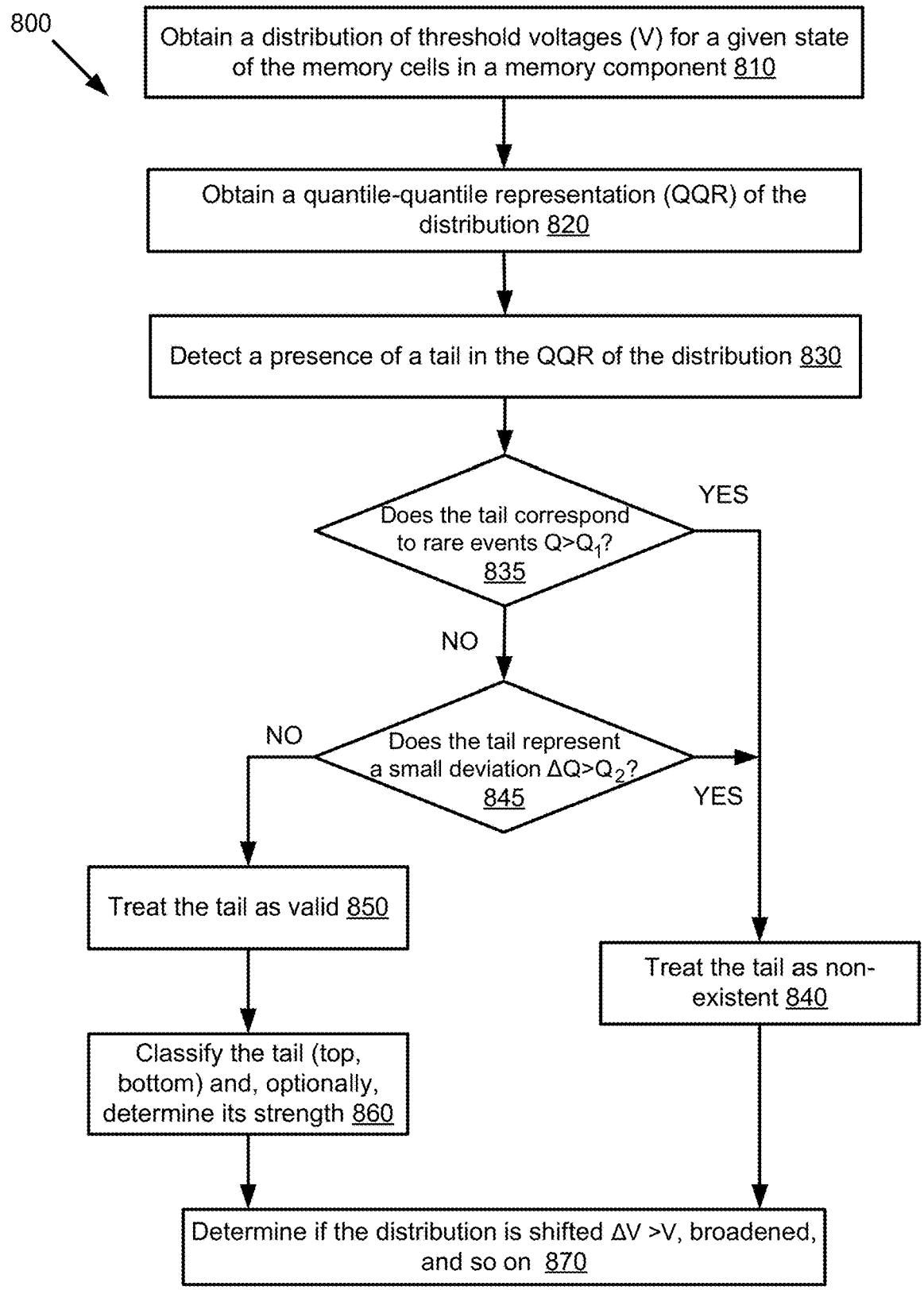
FIG. 8 illustrates a flow diagram of an example method to classify a plurality of distributions of a memory component among one of a plurality of classes, in accordance with some embodiments of the present disclosure.

FIG. 7 and FIG. 8 illustrate method 700 and method 800, respectively. The method 700 or method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular order, unless otherwise specified, the order of the operations can be modified. Thus, the illustrated embodiments should be understood only as examples, and the illustrated operations can be performed in a different order, with some operations can be performed in parallel. Additionally, one or more operations can be omitted in various embodiments. Thus, not all operations of the method 700 or method 800 are required in every embodiment. Other operations flows are possible. In some embodiments, different operations can be used. It can be noted that aspects of the present disclosure can be used for any type of multi-bit memory cells.

FIG. 7 illustrates a flow diagram of an example method 700 to predict a likelihood of a potential failure of a memory device (component), in accordance with some embodiments of the present disclosure. In one embodiment, the FPC 113 can perform the example method 700, based on instructions stored in the embedded memory of the local memory 119. In some embodiments, the firmware of the memory sub-system 110 (or memory device 130) can perform the example method 700. In some embodiments, an outside processing device, such as the processing device of the host system 120, can perform the example method 700.

The method 700 can include obtaining, by a processing device, a plurality of distributions of threshold voltages (operation 710) of a memory component (e.g., memory device 130). The processing device (e.g., processor 117) can be operatively coupled with the memory component. The memory component can include multiple memory cells. Each or some of the memory cells can have multiple states corresponding to various values that can be stored by the memory cells. Each of the plurality of distributions can correspond to one of the states of a memory cell. An SLC memory component can have two distributions, an MLC memory component can have four distributions, a TLC memory component can have eight distributions, a QLC memory component can have sixteen distributions, and so on. In some embodiments, the memory controller 115 can determine the distributions of threshold voltages for a representative subset of memory cell of the memory component. For example, in some embodiments, the subset can include a random sampling of wordlines of the memory component. In some embodiments, a few thousand memory cells can be sampled (e.g., a block of 2 kB of memory). The number of the obtained distributions can be equal to the number of different values that can be stored per memory cell of the component. In some embodiments, the number of the obtained distributions can be less than the number of values that can be stored. For example, the lowest distribution (distribution 0) can be omitted, in some embodiments. In some embodiments, the processing device performing method 700 can obtain the plurality of distributions of threshold voltages in response to the error-correction module detecting that the memory component failed to correctly store data during a store (write) operation.

At operation 720, the processing device performing method 700 can classify each of the plurality of the obtained distributions among one of a plurality of classes. In one exemplary embodiment, a j-th distribution can belong to one of the following seven classes: good distribution ($C_j=0$), top tail distribution ($C_j=1$), bottom tail distribution ($C_j=2$), top and bottom tail distribution ($C_j=3$), broadened distribution ($C_j=4$), shifted distribution ($C_j=5$), and erased distribution ($C_j=6$). In some embodiments, the number of classes can be reduced, e.g., no classes corresponding to broadened and/or shifted distributions are established. In other embodiments, more classes than seven can be used. For example, the top and/or bottom tail distributions can further be subdivided into a number of sub-classes specifying a strength of the respective tail.

At operation 730, the processing device performing method 700 can generate a vector representative of the distributions of the memory component. The vector can have a number of components equal to the number of distributions, e.g., $C=(C_0, C_1=1, \ldots C_7)$. The components of the vector C can represents the class of a respective distribution (memory state). For example, the vector $C=(0, 0, 1, 6, 0, 3, 0, 0)$ can represent that distribution 2 has a top tail, distribution 5 has both a top tail and a bottom tail, distribution 3 is erased, and that the rest of the distributions are good. In some embodiments, the vector C can be alternatively represented using the class as an index (label representation).

For example, the above distributions can be classified as follows (with the specific distributions listed after each class label):

"good": 0, 1, 4, 6, 7;
"top tail": 2;
"bottom tail": -;
"top and bottom tail": 5;
"broadened": -;
"shifted": -;
"erased": 3.

The method 700 can continue, at operation 740, with the processing device analyzing, using a classifier, the generated vector (or its label representation) to determine a likelihood that the memory component is to fail within a target period of time. The classifier can be a machine-learning model trained as described above, in one exemplary representation. In some embodiments, the classifier can be any processor-operated model or code that, once trained, is capable of analyzing the distribution of voltages to determine the likelihood of failure without a human input or oversight. In some implementations, the classifier can be a formula that uses the vector components $C_j$ as inputs, performs a set of mathematical operations on the input vector components and outputs a value representative of the likelihood of failure. In some embodiments, the value can be between 0 and 10 (between 0 and 100, or within any other set range) with 0 indicating an extremely unlikely failure and 10 indicating an almost certain failure. In some embodiments, the output can have a meaning of the estimated probability of failure (e.g., 65%).

FIG. 8 illustrates a flow diagram of an example method 800 to classify a plurality of distributions of a memory component among one of a plurality of classes, in accordance with some embodiments of the present disclosure. In some embodiments, the method 800 can be performed as part of the operation 720 of method 700. In one embodiment, the FPC 113 can perform the example method 800, based on instructions stored in the embedded memory of the local memory 119. In some embodiments, the firmware of the memory sub-system 110 (or memory device 130) can perform the example method 800. In some embodiments, an outside processing device, such as the processing device of the host system 120, can perform the example method 800.

The method 800 can include obtaining, by the processing device, a distribution of threshold voltages for a given state of the memory cells in a second memory component (operation 810). The distribution can be one the distributions depicted in FIGS. 3, 5, and 6, in one exemplary embodiment. The method 800 can continue with the processing device obtaining a quantile-quantile representation (QQR) of the distribution (operation 820) relative to a control distribution. At operation 830, the method 800 can continue with the processing device identifying a presence of a tail in the QQR of the distribution. (The processing device can be able to extract distribution features from a numerical QQR without having to produce the actual plots.) The processing device can be capable of identifying more than one tail, e.g., a first tail (which can be a top tail) and a second tail (which can be a bottom tail). In such instances, the operations described can be performed in relation to both the first tail and the second tail.

At decision-making operation 835, the processing device can determine if the (first or second) tail corresponds to events whose probability of occurrence is below a first cut-off value (e.g., $Q_1$), as explained above in relation to FIGS. 6A-C. If the tail corresponds to such rare events, the method 800 can continue with treating the first tail as non-existent (operation 840). If the tail corresponds to events whose probability of occurrence is below the first cut-off value $Q_1$, the method 800 can proceed to a decision-making operation 845, in which the processing device can determine if the tail corresponds to deviations ΔQ from the control distribution that are below a second cut-off value $Q_2$. If so, the method 800 can proceed to operation 840 and treat the tail as non-existent. In instances, where the tail corresponds to events whose probability of occurrence is at or above what is represented by the second value $Q_2$, the processing device performing method 800 can treat the tail as valid (operation 850). The method 800 can then proceed with identifying the tail as one of a top tail or a bottom tail and assigning the distribution to a respective class of distributions. The method 800 can also (optionally) continue with the processing device identifying if the distribution (first and/or second) is shifted, broadened, etc. (operation 860). The output of the method 800 can be an assignment of the distribution among a number of classes, as described above. The processing device can repeat method 800 for some or all of the obtained distributions of threshold voltages.

Figure 9:
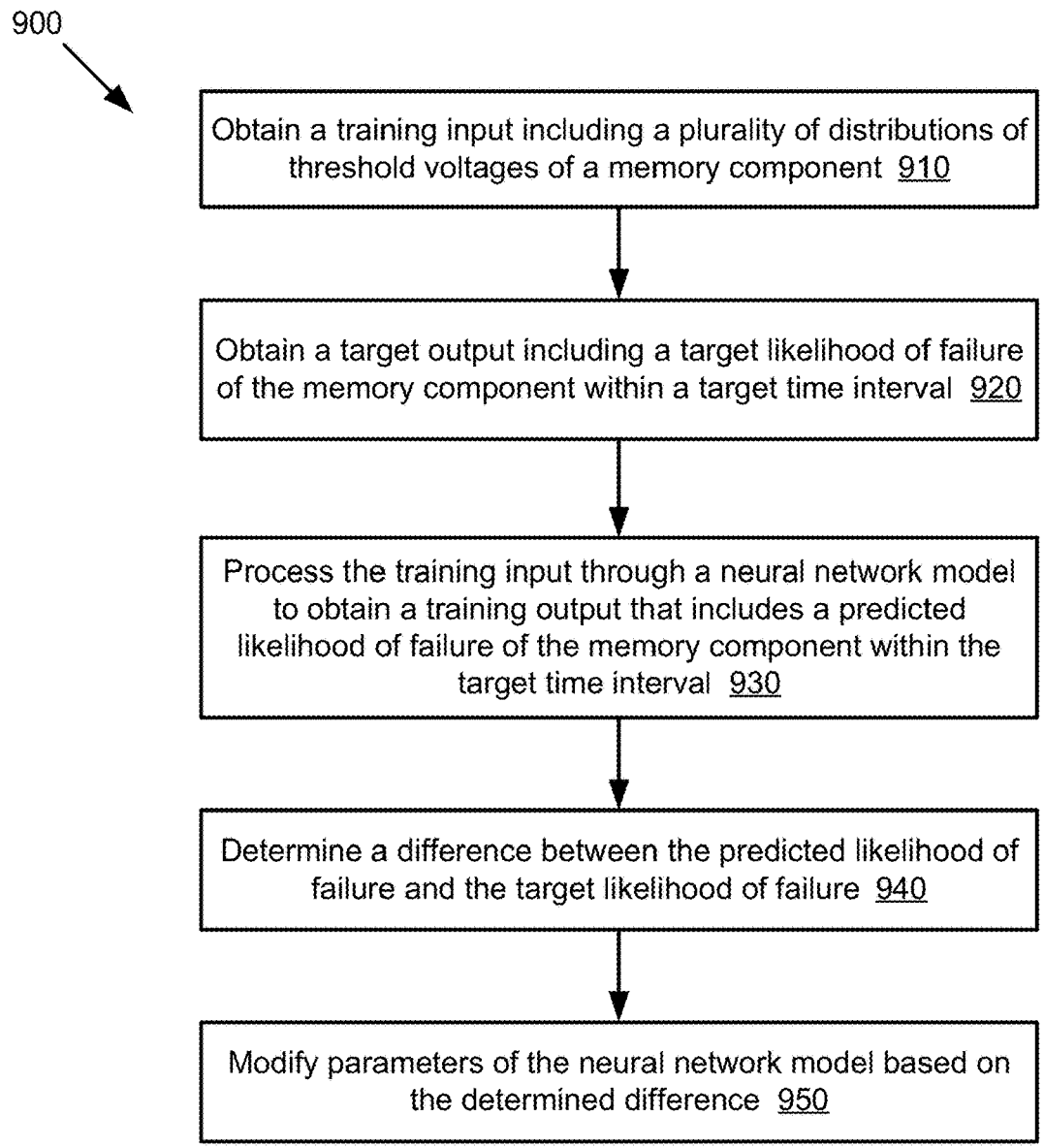
FIG. 9 illustrates a flow diagram of an example method of training a machine-learning model to determine a likelihood of failure of a memory component, in accordance with some embodiments of the present disclosure.

FIG. 9 illustrates is a flow diagram of an example method 900 of training a machine-learning model to determine a likelihood of failure of a memory component, in accordance with some embodiments of the present disclosure. In some embodiments, a processing device of a computing system on the side of a manufacturer of the memory component can perform the example method 900 and implement the trained model in the memory sub-system 110. In some embodiments, the processing device of the host system 120 can perform the example method 900. In one embodiment, the FPC 113 can perform the example method 900. The example method 900 can involve obtaining, by the processing device, a training input that includes a plurality of distributions of threshold voltages of the memory component (operation 910). Each of the plurality of threshold voltages can correspond to one of a plurality of states of the memory cells of the memory component. The example method 900 can continue with the processing device obtaining a target output (operation 920). The target output can include a target likelihood (e.g., a probability) that the memory component is to fail within a target time interval. In some embodiments, the target time interval can be measured in days, weeks, months, etc. In some embodiments, the target time interval can be measured in a number of memory operations (read, write, erase, and so on).

The processing device performing method 900 can process the training input through a neural network model (operation 930). The neural network model can include multiple neurons that are associated with learnable weights and biases. The neurons can be arranged in layers. The neural network model can process the training input through one or more neuron layers and generate a training output. The training output can include a predicted likelihood of a failure of the memory component within the target time interval. In some embodiments, the predicted likelihood can be a numerical value, such as 20%, 65%, and so on. In other embodiments, the predicted likelihood can be a discrete category, such as "very unlikely," "likely," "certainly," and so on. At operation 940, the processing device performing method 900 can determine a difference between the predicted likelihood of failure and the target likelihood of failure. For example, the processing device can determine the difference between the two probabilities (of the predicted likelihood and the target likelihood). In those embodiments, where discrete prediction categories are used, the difference can include an indication of whether the two likelihoods belong to the same category. For example, the processing device can detect no difference if both likelihoods belong to the category "very likely." As another example, the processing device can determine the difference to be "underestimation" if the predicted likelihood belongs to the category "unlikely" and the target likelihood is in the "likely" category.

Having determined the difference of the likelihoods, the processing device can modify (adjust) parameters of the neural network model based on the determined difference (operation 950). Modification of the parameters (e.g., weights, biases, etc., of the neural connections) of the neural network model can be performed, in one exemplary embodiment, by methods of backpropagation. For example, the parameters can be adjusted so to minimize the difference between the target outputs and the predicted outputs generated by the neural network.

In some embodiments, the neural network model can include a first subnetwork of neurons and a second subnetwork of neurons. The first subnetwork can be used to process the training input and to produce an intermediate output, which can include a class to which the distributions belong, The second subnetwork can be used to determine, based on the intermediate output (the class of the distributions), the predicted likelihood of failure.

In some embodiments, the second subnetwork can implement a clustering (grouping) operation using multiple training inputs (distributions) to create groups of vectors, such as vectors C, as described in relation to method 700. For example, the processing device performing method 800 can use one of the clustering algorithms, such as DBSCAN algorithm, autoencoders (e.g., variational autoencoders), K-means clustering, expectation-maximization algorithms, mean-shift algorithms, termination algorithms, generalization algorithms, singular value decomposition algorithms, or other appropriate algorithms.

Once the clusters (groups of vectors C) are determined during the training phase, the clusters can be used in the identification phase. The processing device (e.g., the device performing methods 700 and 800) can compare the value of the vector C of the target memory device being tested and determine to which cluster this vector belongs. The proximity of the vector to a particular cluster can be estimated via a similarity function (affinity function, similarity measure) or a difference function. For example, a j-th cluster can have certain centroid values for each of the components of vectors C that belong to that cluster. The processing device can determine the affinity of the vector C to the j-th cluster by calculating the distance (in the vector component space) between the vector C of the target memory component and each of the cluster centroids determined during training.

The clusters (groups) can depend on the features of multiple (in some embodiments, all) distributions. For example, a cluster can include distributions (memory devices) that are characterized by "top tails in distributions 0, 1, 3 and bottom tails in distributions 5 and 6." Another cluster can include instances of "top and bottom tails in at least three distributions." In some embodiments, the clusters can include the context that led the processing device to seek distribution data (e.g., the history of operations leading to an error that the ECC failed to correct), or a physical context of the memory device (e.g., whether the memory component selected for analysis is fully or partially programmed). For example, a cluster can include "top tails in distributions 5, 6, and 7 after multiple reads on a partially programmed block."

Figure 10:
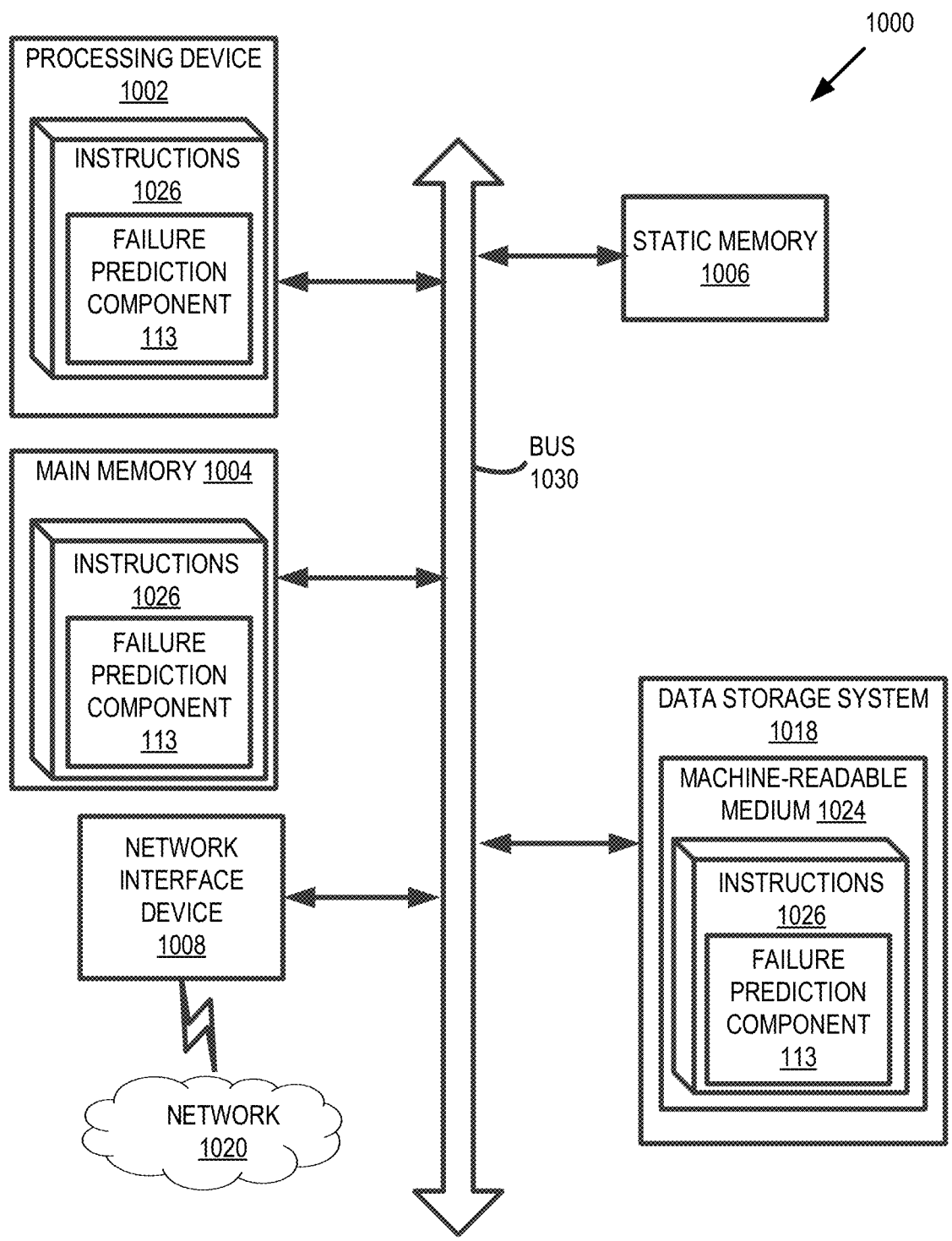
FIG. 10 a block diagram of an example computer system in which embodiments of the present disclosure may operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the failure prediction component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a non-transitory computer-readable storage medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory subsystem 110 of FIG. 1.

In one embodiment, the instructions 1026 include instructions to implement functionality corresponding to the failure prediction component 113 of FIG. 1. While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" or the like throughout is not intended to mean the same embodiment or embodiment unless described as such. One or more embodiments or embodiments described herein may be combined in a particular embodiment or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device comprising a plurality of memory cells, wherein each memory cell of the plurality of memory cells is capable of being in a plurality of memory states; and
    a processing device, operatively coupled with the memory device, to perform operations comprising:
        obtaining, for the plurality of memory cells, a plurality of distributions of threshold voltages, wherein each of the plurality of distributions corresponds to a respective one of the plurality of memory states; and
        processing, using a classifier, a digital representation of the plurality of distributions to determine a likelihood that the memory device will fail within a target period of time.

2. The system of claim 1, wherein processing the digital representation of a first distribution of the plurality of distributions comprises:
  identifying a tail in the first distribution relative to a control distribution.

3. The system of claim 2, wherein processing the digital representation of the first distribution further comprises:
  evaluating a probability of occurrence of events that correspond to the tail in the first distribution.

4. The system of claim 2, wherein processing the digital representation of the first distribution further comprises:
  evaluating a magnitude of a deviation of the tail in the first distribution from the control distribution.

5. The system of claim 2, wherein the digital representation of a second distribution of the plurality of distributions comprises:
  evaluating a magnitude of a shift of the second distribution relative to the control distribution.

6. The system of claim 1, wherein the classifier comprises a machine learning model trained using a training plurality of distributions comprising at least one of: (i) one or more distributions of threshold voltages for a failed memory device, (ii) one or more distributions of threshold voltages for a good memory device, or (iii) one or more distributions of threshold voltages for a good memory device, modified to simulate a failed memory device.

7. The system of claim 1, wherein obtaining the plurality of distributions of threshold voltages is responsive to an error-correction module detecting that the memory device failed to correctly store data following a store operation.

8. A method comprising:
  obtaining, by a processing device operatively coupled with a memory device comprising a plurality of memory cells capable of being in a plurality of memory states, a plurality of distributions of threshold voltages, wherein each of the plurality of distributions corresponds to a respective one of the plurality of memory states; and
  processing, using a classifier, a digital representation of the plurality of distributions to determine a likelihood that the memory device will fail within a target period of time.

9. The method of claim 8, wherein processing the digital representation of a first distribution of the plurality of distributions comprises:
  identifying a tail in the first distribution relative to a control distribution.

10. The method of claim 9, wherein processing the digital representation of the first distribution further comprises:
  evaluating a probability of occurrence of events that correspond to the tail in the first distribution.

11. The method of claim 9, wherein processing the digital representation of the first distribution further comprises:
  evaluating a magnitude of a deviation of the tail in the first distribution from the control distribution.

12. The method of claim 9, wherein the digital representation of a second distribution of the plurality of distributions comprises:
  evaluating a magnitude of a shift of the second distribution relative to the control distribution.

13. The method of claim 8, wherein the classifier comprises a machine learning model trained using a training plurality of distributions comprising at least one of: (i) one or more distributions of threshold voltages for a failed memory device, (ii) one or more distributions of threshold voltages for a good memory device, or (iii) one or more distributions of threshold voltages for a good memory device, modified to simulate a failed memory device.

14. The method of claim 8, wherein obtaining the plurality of distributions of threshold voltages is responsive to an error-correction module detecting that the memory device failed to correctly store data following a store operation.

15. A non-transitory computer-readable medium storing instructions thereon that, when executed by a processing device, cause the processing device to perform operations comprising:
  obtaining, for a memory device comprising a plurality of memory cells capable of being in a plurality of memory states, a plurality of distributions of threshold voltages, wherein each of the plurality of distributions corresponds to a respective one of the plurality of memory states; and
  processing, using a classifier, a digital representation of the plurality of distributions to determine a likelihood that the memory device will fail within a target period of time.

16. The non-transitory computer-readable medium of claim 15, wherein processing the digital representation of a first distribution of the plurality of distributions comprises:
  identifying a tail in the first distribution relative to a control distribution.

17. The non-transitory computer-readable medium of claim 16, wherein processing the digital representation of the first distribution further comprises at least one of:
  evaluating a probability of occurrence of events that correspond to the tail in the first distribution; or
  evaluating a magnitude of a deviation of the tail in the first distribution from the control distribution.

18. The non-transitory computer-readable medium of claim 16, wherein the digital representation of a second distribution of the plurality of distributions comprises:
  evaluating a magnitude of a shift of the second distribution relative to the control distribution.

19. The non-transitory computer-readable medium of claim 15, wherein the classifier comprises a machine learning model trained using a training plurality of distributions comprising at least one of: (i) one or more distributions of threshold voltages for a failed memory device, (ii) one or more distributions of threshold voltages for a good memory device, or (iii) one or more distributions of threshold voltages for a good memory device, modified to simulate a failed memory device.

20. The non-transitory computer-readable medium of claim 15, wherein obtaining the plurality of distributions of threshold voltages is responsive to an error-correction module detecting that the memory device failed to correctly store data following a store operation.

* * * * *